MULTIBAND OSCILLATOR

Filed Feb. 7, 1948

INVENTORS.
JOHANNES MARINUS LODEVICUS JANNSEN
LUKAS ENSING.
BY [signature]
AGENT.

Patented Nov. 4, 1952 2,617,035

UNITED STATES PATENT OFFICE 2,617,035

MULTIBAND OSCILLATOR

Johannes Marinus Lodevicus Janssen and Lukas Ensing, Eindhoven, Netherlands, assignors to Hartford National Bank and Trust Company, Hartford, Conn., as trustee Application February 7, 1948, Serial No. 6,856
In the Netherlands February 17, 1947

3 Claims. (Cl. 250—36)

Figure 1:
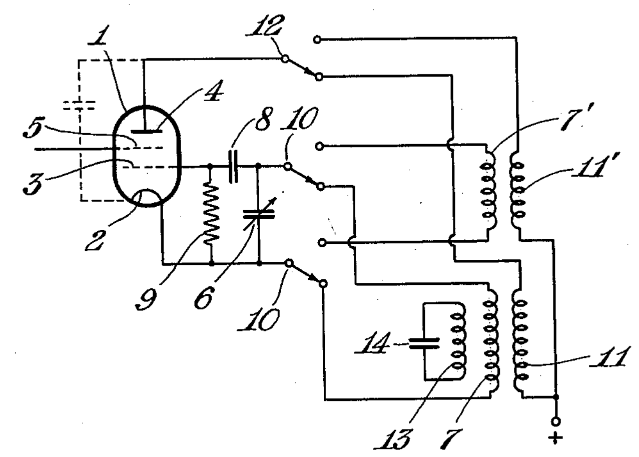

This invention relates to arrangements in which high-frequency oscillations are generated by means of a discharge tube connected as an oscillator or in which oscillations are amplified, the frequency being determined by a circuit comprising an inductance and a capacity, and the frequency being variable by means of a tuning member by which the capacity of the circuit may be varied continuously, while furthermore a switching member is provided by means of which the inductance of the circuit is variable in a stepwise manner, so that the frequency in at least two different ranges of frequencies is adjustable continuously by means of the tuning member. The term "switching member" may in this case also be understood to mean a device for interchanging inductance coils.

Such an arrangement may be used, for example, in broadcast receivers tunable in a broad range of frequencies or in frequency meters wherein an oscillation supplied from without is to be compared with an oscillation, generated in the arrangement itself, having a frequency which is to be accurately determined and which is also desired to be variable within the two limits.

It may occur, for example, that it must be possible for an oscillation of any arbitrary and accurately determined frequency to be generated within a broad range comprised, for example, between 100 and 25,000 kilocycles/sec. It is known to utilise for this purpose a feedback oscillator comprising a frequency-determining oscillatory circuit, which is tunable continuously by means of a condenser, and a set of interchangeable coils for the frequency-determining circuit so as to obtain, for example, the following tuning ranges:

100 kilocycles/sec.–250 kilocycles/sec.
200 kilocycles/sec.–500 kilocycles/sec.
500 kilocycles/sec.–1,250 kilocycles/sec.
1,000 kilocycles/sec.–2,500 kilocycles/sec.
2,000 kilocycles/sec.–5,000 kilocycles/sec.
5,000 kilocycles/sec.–12,500 kilocycles/sec.
10,000 kilocycles/sec.–25,000 kilocycles/sec.

In the various ranges the ratio of the limiting frequencies is naturally the same since it is determined by the ratio between the limiting values of the capacity of the tuning condenser. By a correct choice of the coil and of the adjustment of the condenser it is thus possible to ensure any arbitrary frequency within a range from 100 to 25,000 kilocycles/sec. In such an oscillator it is, as a rule, necessary that the back-coupling coil should be interchanged at the same time as the coil of the frequency-determining circuit. To this end, the said coils are preferably combined pairwise to form one unit housed in a screening bushing. Instead of utilising interchangeable coils, it is naturally also possible to use a switching device which permits of switching-in the different coils one after another.

The tuning condenser usually exhibits a graduation from which the frequency tuned-in may be read.

However, a disadvantage of the known device is that the frequency variation in the various ranges as a function of the displacement of the tuning member is not the same, in other words, the various graduations do not correspond to one another and for this reason it is necessary to provide a plurality of graduations. This disadvantage chiefly occurs in the highest frequency range and is substantially due to the parasitic capacities between the electrodes of the tubes and more particularly to the capacity between the anode and the cathode and of the wiring, which parasitic capacity, jointly with the parasitic inductance of the various connecting wires, gives rise to a divergence of the frequency graduation in this region.

The object of the invention is to obviate the said disadvantage so that the ratio of the difference between the frequency corresponding to a determined division and a limiting frequency to the difference between the limiting frequencies is the same for each range. Consequently, in this case the relative frequency variation upon a determined displacement of the member serving for the continuous tuning is the same in each range and it is possible to provide this member with a single graduation which may serve for all ranges. Each range then corresponds to a determined factor by which the figures for the graduation are required to be multiplied for obtaining the tuning frequency for the range concerned.

The invention consists in that, upon tuning to the lower range or the lower ranges, the frequency-determining circuit is coupled to an auxiliary circuit which comprises an inductance and a capacity and of which the natural frequency lies higher than that of the said frequency-determining circuit. The invention comes to the facts that the graduation for the highest range serves as a basis and that the auxiliary circuit introduces deviations in the other ranges such that the graduations for these ranges are matched to that for the highest range.

When the switching operation is effected by interchanging the coil system, the said auxiliary circuit may form part of the coil systems for the lower frequency ranges and be united with the latter in a single screening bushing.

It is observed that it is known per se to balance oscillatory circuits. This occurs, for example, in superheterodyne receivers in which a constant frequency-difference between two circuits is desired. As a rule, this is effected by connecting capacities in series and/or in parallel to the tuning condenser. In the arrangement according to the present invention, however, a constant frequency-difference is not essential so that in this case other means are required to ensure the desired balancing effect.

In order that the invention may be clearly understood and readily carried into effect, it will now be described more fully by reference to the accompanying drawing.

Figure 1 shows a circuit diagram of an arrangement according to the invention in which all parts not essential to the invention are omitted for the sake of simplicity. In this figure reference numeral 1 indicates a discharge tube comprising a cathode 2, a control grid 3, a screen grid 5, and an anode 4, which tube is connected as an oscillator. For this purpose an oscillatory circuit comprising a capacity 6 and an inductance 7 is connected between the cathode and control grid of the tube, the top end of this oscillator circuit being connected via a condenser 8 to the control grid and the bottom end directly to the cathode. The grid 3 is connected via a leak resistance 9 to the cathode. The anode circuit includes a coil 11, coupled regeneratively to the inductance 7, so that in the circuit 6, 7 are generated oscillations having a frequency which is variable within determined limits by adjusting the condenser 6. In order to permit variation of frequency within very broad limits, the coils 7 and 11 may be substituted for other coils having different inductance values. This may be effected, for example, by making the connecting terminals 10 and 12 of the said coils in the form of plug-contacts.

It is found in practice that the frequency variation in the different ranges as a function of the angle of rotation of the tuning condenser 6 is not the same, which is chiefly due to the parasitic capacity (shown in dotted line) between the anode 4 and the cathode 2 in conjunction with the dispersion inductance of the coil 11 and the natural inductance of the wire connecting this coil and the anode, which quantities naturally are of great influence in the range of the highest frequencies. According to the invention, in order to improve this and to ensure that the graduations correspond to one another in all ranges, the sets of coils for the lower frequencies comprise auxiliary circuits 13, 14, the inductance 13 of which is coupled to the inductance 7 of the frequency-determining circuit, the capacity 14 of which is chosen to be such that the tuning of each auxiliary circuit lies above the tuning of the circuit 6, 7 when the coil 7 associated with the auxiliary circuit is switched-in. It has been found that by suitable choice of the coupling between the coils 7 and 13 and of the condenser 14 it is possible to ensure a balancing effect such that for a given incremental variation in the value of condenser 6 there is produced a predetermined percentage change in the tuning of said circuit that is substantially the same in all ranges, so that the graduations for these ranges correspond to one another.

The values of the inductance 13 and of the condenser 14 are naturally dependent on the region tuned in, in connection with which upon changing-over to another region it will, as a rule, be necessary to switch in at the same time another auxiliary circuit 13, 14. This may be effected in a simple manner by combining the auxiliary circuit and the interchangeable coil to form one unit.

The fact that balancing in the above-mentioned sense may be ensured by the use of the circuit 13, 14 may readily be appreciated when considering that the condenser 14 brings about a similar deviation in the lower range of frequencies as the anode-cathode capacity of the tube 1 in the highest frequency range.

Figure 2:
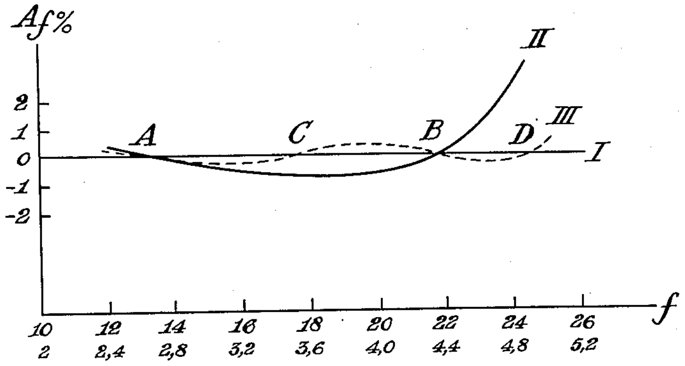

Fig. 2 shows some curves with the aid of which the invention may be explained more fully. The said curves show the relative frequency deviations in the range comprised between 2,000 and 5,000 kilocycles/sec., when the highest range comprised between 1,000 and 25,000 kilocycles/sec. is considered as a norm. Consequently, the horizontal curve I applies to the said range. The curve II shows the frequency deviations, expressed in percentage, for the divisions of the graduation applying to the range from 10,000 to 25,000 kilocycles/sec., if the invention is not used. By suitable adjustment of the inductance of coil 7 and of the zero capacity of condenser 6 it may be ensured, for example, that the frequency deviation is zero at two arbitrary points A and B. The curve shows, however, that the deviation at other points and more particularly in the upper part of the range is then rather considerable. When using the invention there are two more degrees of freedom in adjusting. It is possible, for example, to make the capacity 14 and the coupling between the coils 13 and 7 adjustable so as to ensure so-called fourpoint adjustment, in which event four points of the deviation curve coincide with the horizontal line I, for which the points A and B previously referred to and two further points C and D may be chosen. The curve shows that the resultant deviation curve 3 approaches the ideal I comparatively closely. It is possible to provide point B at the top and points C and D between A and B.

Figure 3:
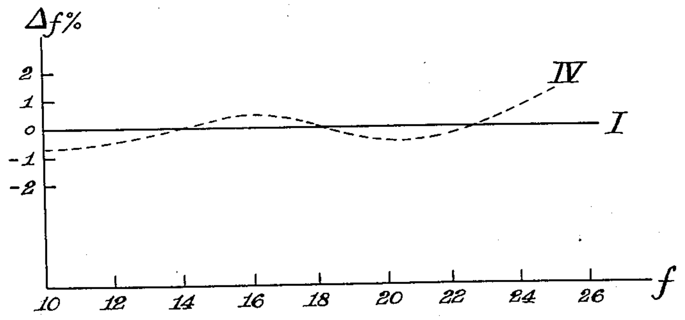

A disadvantage of the use of the circuit 13, 14 is that the capacity 14 effectively increases the zero capacity of the condenser 6 and this is to be taken into account in proportioning the said condenser. However, in practice it is naturally impossible to give the zero capacity of the condenser 6 any arbitrarily low value. For this purpose the capacity of the condenser 14 may be given the smallest possible value so that one of the degrees of freedom is sacrificed and it is only possible to ensure balancing by adjusting, for example, the coupling between the coils 13 and 7. In this case a three-point adjustment ensues as shown in Fig. 3, in which event the deviations of the curve 4 with respect to curve I are still comparatively small and in most cases sufficient approximation is ensured in practice.

Figure 4:
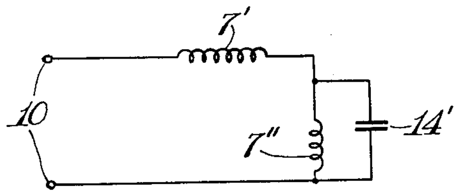

It is possible to design the circuit-arrangement as shown diagrammatically in Fig. 4. The coil 7 is here divided into two parts 7′ and 7″, connected in series, the condenser 14′ being connected to the part 7′. The values of 7′, 7″ and 14′ may be such that this circuit is in electrical respect wholly identical with that shown in Fig. 1.

The invention is also applicable when the arrangement, instead of comprising an oscillator, comprises for example only one or more oscillatory circuits, which are required to be adjustable in a broad range of frequencies and for this purpose a continuous adjustment and a stepwise adjustment are provided.

What ws claim is:

1. A multiband variable frequency resonant circuit for use with a discharge tube, said circuit comprising a variable capacitance for adjusting the tuning of said circuit within each frequency band, a plurality of inductances, each inductance having a value corresponding to a different frequency band, means selectively to connect any one of said inductances across said capacitance whereby when a particular inductance is connected across said capacitance said multiband resonant circuit is operative within the frequency band corresponding to said particular inductance, and a resonant network coupled to one of said inductances and having a fundamental frequency which is higher than the fundamental frequency of said multiband resonant circuit as determined by said one inductance to produce a tuning condition in said multiband resonant circuit at which for a given incremental variation in the value of said capacitance there is produced a predetermined percentage change in the tuning of said circuit regardless of the frequency band in which said circuit is operative whereby a common scale may be used for all frequency bands.

2. A multiband variable frequency resonant circuit as set forth in claim 1 wherein said resonant network is inductively coupled to said one inductance.

3. A multiband variable frequency resonant circuit as set forth in claim 1 wherein said resonant network is serially coupled to said one inductance.

JOHANNES MARINUS LODEVICUS JANSSEN.
LUKAS ENSING.

REFERENCES CITED

The following references are of record in the file of this patent:

UNITED STATES PATENTS

| Number | Name | Date |
|---|---|---|
| 1,597,420 | Austin | Aug. 24, 1926 |
| 1,943,790 | Franks | Jan. 16, 1934 |
| 2,061,991 | Wheeler | Nov. 24, 1936 |
| 2,279,319 | Honaman | Apr. 14, 1942 |
| 2,283,653 | Siemens | May 19, 1942 |
| 2,355,470 | Root | Aug. 8, 1944 |
| 2,398,112 | O'Brien | Apr. 9, 1946 |

FOREIGN PATENTS

| Number | Country | Date |
|---|---|---|
| 264,239 | Great Britain | Jan. 17, 1927 |

OTHER REFERENCES

The Radio Amateur's Handbook (1946 edition), American Radio Relay League, pp. 235 to 237.